(12) United States Patent
Magro et al.

(10) Patent No.: US 6,889,334 B1
(45) Date of Patent: May 3, 2005

(54) MULTIMODE SYSTEM FOR CALIBRATING A DATA STROBE DELAY FOR A MEMORY READ OPERATION

(75) Inventors: James R. Magro, Austin, TX (US); Bruce A. Loyer, Austin, TX (US); Pratik M. Mehta, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 681 days.

(21) Appl. No.: 09/969,300

(22) Filed: Oct. 2, 2001

(51) Int. Cl.[7] .............................................. G06F 1/06
(52) U.S. Cl. ..................... 713/500; 713/400; 713/401; 713/500; 713/503; 713/600; 324/130; 327/136; 327/263; 327/276; 327/392; 365/189.01; 365/193; 365/194; 702/85; 702/89; 714/724; 714/814; 714/815
(58) Field of Search ........................... 713/400, 401, 713/500, 503, 600, 1, 2; 324/130; 327/136, 263, 276, 392; 365/189.01, 193, 194; 702/85, 89; 714/724, 814, 815; 711/5, 154, 167; 710/22, 23, 25

(56) References Cited

U.S. PATENT DOCUMENTS

| | | | | |
|---|---|---|---|---|
| 4,782,486 A | * | 11/1988 | Lipcon et al. | .............. 714/722 |
| 5,598,540 A | * | 1/1997 | Krueger | ...................... 710/104 |
| 5,794,175 A | * | 8/1998 | Conner | ....................... 702/119 |
| 5,948,083 A | | 9/1999 | Gervasi | |
| 6,043,694 A | | 3/2000 | Dortu | |
| 6,112,284 A | * | 8/2000 | Hayek et al. | ................ 711/167 |
| 6,215,726 B1 | | 4/2001 | Kubo | |
| 6,292,521 B1 | * | 9/2001 | Lai et al. | ...................... 375/357 |
| 6,316,980 B1 | | 11/2001 | Vogt et al. | |
| 6,401,213 B1 | * | 6/2002 | Jeddeloh | ...................... 713/401 |
| 6,442,102 B1 | | 8/2002 | Borkenhagen et al. | |
| 6,466,491 B2 | * | 10/2002 | Yanagawa | .................... 365/194 |
| 6,467,043 B1 | * | 10/2002 | LaBerge | ...................... 713/401 |
| 6,493,285 B1 | | 12/2002 | Wolford | |
| 6,512,704 B1 | * | 1/2003 | Wu et al. | .............. 365/189.07 |
| 6,570,944 B2 | | 5/2003 | Best et al. | |
| 6,581,017 B2 | | 6/2003 | Zumkehr | |
| 6,629,225 B2 | * | 9/2003 | Zumkehr | ..................... 711/167 |
| 6,658,604 B1 | | 12/2003 | Corbin et al. | |
| 6,665,230 B1 | * | 12/2003 | Shrader et al. | ............. 365/233 |
| 6,691,214 B1 | * | 2/2004 | Li et al. | ...................... 711/167 |
| 6,760,856 B1 | | 7/2004 | Borkenhagen et al. | |
| 2002/0087768 A1 | | 7/2002 | Srikanth et al. | |
| 2002/0160558 A1 | * | 10/2002 | Ernst et al. | ................. 438/200 |

OTHER PUBLICATIONS

IBM_TDB vol. 33, Issue 6A, page number 265–266, Title: "Self–configuring look–up table–controlled DRAM memory controller"; dtd. Nov. 1, 1990.*
U.S. Appl. No. 09/969,304, filed Oct. 2, 2001.
U.S. Appl. No. 09/969,302, filed Oct. 2, 2001.
"DDR SDRAM Functionality (and Controller Read Data Capture)", *Micro Design Line*, vol. 8, Issue 3, Third Quarter, 1999, Micron Technology, Inc., Boise, Idaho.

* cited by examiner

Primary Examiner—Lynne H. Browne
Assistant Examiner—Nitin Patel
(74) Attorney, Agent, or Firm—Meyertons Hood Kivlin Kowert & Goetzel, P.C.; B. Noël Kivlin

(57) ABSTRACT

A system for coordinating the timing of a data strobe with data supplied by a memory module to the memory controller read data FIFO of a processor-based system, providing multiple calibration modes. A calibration PDL (programmable delay line) is used to reiteratively test the time taken for a test data strobe to traverse a portion of the memory controller circuit, and to generate a calibration value based upon the time taken. The calibration procedure may be initiated in any one of several modes, including: according to a predetermined schedule; implemented in software; in response to changes in environmental factors such as temperature or voltages sampled at one or more locations; in response to a software-driven trigger; or in response to a user-initiated trigger, communicated to a system of the invention either by input via a user interface to the processor-based system or by a software command.

35 Claims, 7 Drawing Sheets

MULTIMODE SYSTEM FOR CALIBRATING A DATA STROBE DELAY FOR A MEMORY READ OPERATION

BACKGROUND OF THE INVENTION

The present invention relates to the positioning of a data strobe within a data valid window in a processor-based system that executes data read and write operations by accessing memory modules such as DIMMs (double in-line memory modules). In particular, the system and method described herein are adapted to accommodate the stringent requirements presented by DDR (double-data read) systems, which clock memory data at both the positive and negative edges of a data strobe (referred to as DQS) signal, and which are becoming more common in high-end computer systems.

DDR devices use a source-synchronous clocking mechanism (the DQS strobe) to transfer data between the DDR device and the memory controller. During a read access, the DDR device provides read data substantially aligned with the DQS data strobe, and the memory controller, such as a DDR SDRAM controller, delays the DQS data strobe by an amount determined to accommodate the appropriate setup and hold delays for the accessed device, thus allowing the requested data to be correctly captured. In a write operation, the memory controller coordinates the data storage so that it occurs within the data valid window.

A read operation is illustrated in FIG. 1, where line 1A shows the timing of a data stream 100, a DQS data strobe 102 for the data stream 110, and the DQS strobe 104 after a predetermined delay. Each data period 110, 120, 130, 140 . . . (corresponding to requested data bytes) of the data stream 100 has an initial transition period (111, 121, etc.); a setup period (112, 122, etc.); a hold period (114, 124, etc.); and a tail transition period (115, 125, etc.).

Generally, the "setup" time or period for a given device is the time required for that device to stabilize after receiving a command, data or other signal. In the case of a read request, typically there will be a read-data FIFO queue, and the setup time is the time needed by that FIFO (in particular, one or more flip-flops within that FIFO) to stabilize the data. The "hold" time or period is the time that the device (or the FIFO) is designed to keep the requested data available before the next data cycle.

For example, in the case of a read-data request for a DDR device, the relevant JEDEC standard (the Double Data Rate (DDR) SDRAM Specification JESD79—June 2000, which is incorporated herein by reference) specifies the setup and hold period durations for 133 MHz and 100 MHz system clocks. For example, it is appropriate if a setup and hold period in the aggregate amount to at least 35% of the data capture period. Thus, if the system runs at 100 MHz, the data capture period is 10 ns, so the setup/hold period is 3.5 ns. There are two such 3.5 ns periods for each 10 ns period in a DDR system, since data is clocked on both rising and falling edges of the system clock, i.e. in FIG. 1 both on positive edges 150, 170, 190, etc. and on negative edges 160, 180, etc. of the data strobe DQS.

In FIG. 1, region 111 of the data period 110 is the initial transition period following a data read request, during which the data bits are sent by a DIMM or other memory device to the read data FIFO. Region 112 is the setup time for the read data FIFO. For data to be reliably captured, the setup time 112 and hold time 114 should be at least some minimum time specified for the given device, e.g. a flip-flop for the FIFO.

The rising edge 155 of an appropriately delayed DQS strobe should occur no earlier than the minimum setup time required by the device in question, and before the end of the hold period.

FIGS. 2A–2C are timing diagrams illustrating possible arrival times of the DQS data strobe at a requesting device with respect to a data signal 110. FIG. 2A shows the arrival of a rising edge 152 of a DQS strobe during the setup time 112. When this occurs, spurious data can be captured, since the receiving device may not have had time to stabilize. In order to avoid this, in present systems a circuit may be used that delays the issuance of the DQS strobe, so that it arrives at the requesting device after the setup requirement is met for the receiving device, and not so late as to exceed the hold duration.

However, care must be taken that the DQS is not delayed too much, or it might occur at or near the end of the hold period 114, as in FIG. 2B, with the risk of attempting to capture the data during the tail transition time, again leading to erroneous data.

Ideally, the DQS is delayed as in FIG. 2C, so that it is presented to the requesting device after the setup 112 has taken place and before the end of the hold period 114.

Not only does the setup take a certain amount of time, but the bits that make up a data word may take different paths from a memory device (e.g. a DIMM) through the system (even though they are all on the same bus), resulting in misalignment—i.e., different arrival times at the requesting device. Thus, as FIG. 3 illustrates, for an eight-bit byte, some bits (e.g., data bits 0 and 1) may arrive before others (e.g., bits 2, 3 and 7), and it is important that the DQS strobe does not occur before all bits are present, or the captured data will be incorrect.

The above factors can shrink the window in which the DQS can be issued and reliably capture the desired data. Because of the bits arriving at different times, the reliable data capture window may be reduced by 80–90%, in the present example resulting in, perhaps, a 400–500 ns window.

Current systems may use phase-locked loops (PLLs) or other mechanisms to compensate for circuit timing variations caused by PVT (process-voltage-temperature) differences. Such mechanisms will keep the system clock's frequency within the capture and tracking ranges of the PLL, but this does not solve the problem of timing a DQS strobe as discussed above.

A PLL is inappropriate to time a DQS strobe, in part because a PLL requires a constant clock signal (unlike a DQS strobe, which can stop between data transfers); and additionally, because a PLL is designed to minimize variations in signal frequencies (and hence timing differences), whereas a DQS strobe must be affirmatively delayed for correct timing with the data signals.

A delay line may be used for this purpose, i.e. to compensate for PVT in timing the DQS to track the setup and hold time periods. E.g., if the entire data signal 110 (including transition, setup and hold periods) takes 5 ns, then a fixed delay of about 2½ ns would place the DQS near the center of the 3½ ns window 116. This would delay the DQS rising edge 155 (see FIG. 1) for the appropriate time. If the initial transition time is no more than ½ ns, then the fixed 2½ ns delay would put the rising edge 155 at the 3-ns point in the 5-ns window 116, and within the 3½ ns setup/hold period (112 plus 114).

A problem with attempting to specify a fixed delay period is that as the chip or circuit warms up under load, the delay period will lengthen, while the data window remains within tight parameters, while the "fixed" delay period typically may vary to a greater degree. In this case, a situation as illustrated in FIG. 2B can occur. Compensation for heating by reducing the delay time can pull the DQS strobe back too far, as in FIG. 2A, when the load on the circuit load is reduced. Although tight circuit board specifications can alleviate this—e.g. by careful routing and linking the data lines as closely as possible to the clock—the problem of DQS strobe timing persists.

Because of strict DDR timing requirements and faster computer systems in general, a system is needed that reliably increases the rate of data transfer operations while taking PVT variations into account. In particular, such a system is needed that can dynamically compensate for PVT changes, substantially in real time or as desired by a user, and ensure that data strobes are provided to a receiving device during the data valid window.

Once the problem of timing the DDR DIMM strobe with a data valid window is solved, as in the present application, a determination must be made of when to carry out a calibration operation, so that correct timing compensation can be achieved. In particular, the calibration operation must avoid corrupting data transfers, such as a read data capture, and should be carried out frequently enough to track potential or actual changes in propagation times. A system is needed that can accommodate both on-demand and automatically scheduled calibration operations.

SUMMARY OF THE INVENTION

An apparatus and method according to one embodiment of the present invention are implemented in a processor-based system by providing programmable delay line (PDL) on the DQS strobe line to a read data FIFO. The PDL includes a series of delay buffer elements, such that the more delay buffers that are selected, the longer the DQS strobe is delayed. The number of delay buffers selected is thus determined by what delay is needed to position the DQS in the data valid window for data provided to the read data FIFO.

This number of buffers can be selected by a user. However, an autocalibration subsystem is also described herein, which is configured to recalibrate delay time either at a predefined periodicity or at times selected by a user or by software, such as in response to temperature or voltage variations.

The autocalibration subsystem generates a clock signal and a pseudo-data signal, and determines the number of delay buffers needed to delay the DQS strobe until the end of the pseudo-data signal. This number is then adjusted downwards as needed to place the DQS strobe where desired in the data valid window, and is input to the actual PDL for the read data FIFO circuit.

The autocalibration mechanism can also be disabled, and a preselected delay value used in the actual PDL, if desired. Thus, a user may set a particular delay value, which remains unchanged until manually reset or reset by software at a later time.

Accordingly, the description of the present embodiment of the invention presents both a system that solves the problem of dynamic, real-time calibration of a data retrieval operation such that the data strobes are timed in the data valid windows.

A system according to the present invention allows several modes of operation of such a system to allow flexibility in its use and applications. Specifically, the modes of operation may include the execution of a calibration operation at any of several events, including: a timed event according to a predetermined schedule; a response to external factors such as change in temperature or sample voltage; and a manual calibration trigger, i.e. a calibration operation initiated by a user, either by a real-time interaction with a computer system or via software.

DESCRIPTION OF THE PREFERRED EMBODIMENTS

Figure 4:
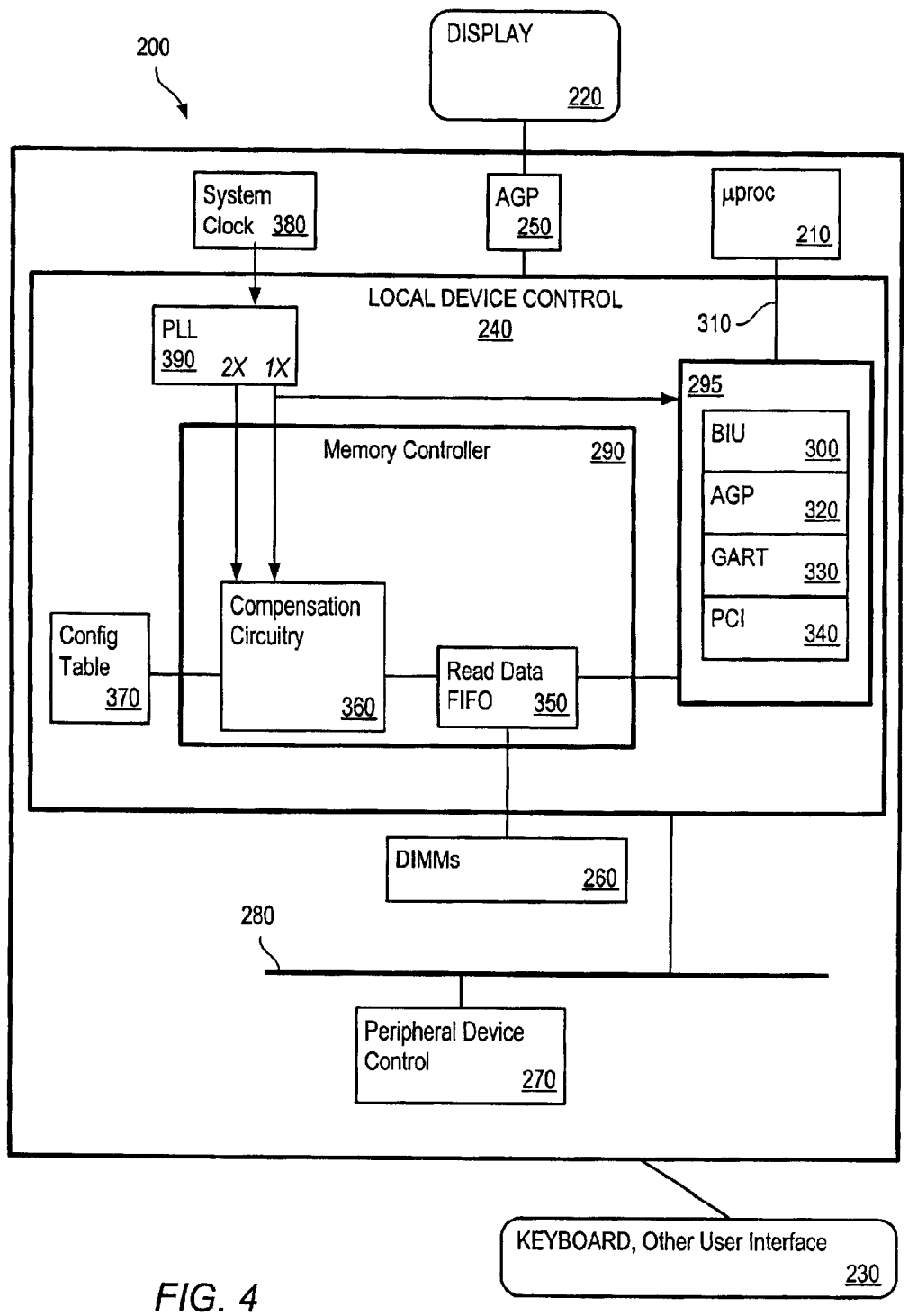
FIG. 4 is a block diagram of a processor-based system incorporating an embodiment of the present invention.

FIG. 4 is a block diagram of a processor-based system 200, such as a workstation or server, incorporating features implementing an embodiment of the present invention. The system 200 operates under control of at least one microprocessor 210, a display 220 and one or more user interface devices 230 (such as keyboard, mouse, track ball, etc.).

The processor 210 is connected to a local device control circuitry 240 (also referred to as a "host bridge"), which includes circuitry that controls data and command exchanges with local devices such as the display 220 via an accelerated graphics processor (AGP) 250 and memory 260, which may in a typical system will include multiple DIMMs and/or other suitable memory modules or media.

The local device control circuitry 240 is connected to a peripheral device control circuit 270 via a bus such as PCI bus 280.

The local device control circuitry 340 may in many respects include conventional or known circuitry (with the addition of the inventive features described below), but may in particular incorporate features of the system controller (e.g., the "Northbridge"—i.e. AMD-761™ or 762™ —controller) circuits of Advanced Micro Devices, Inc. (AMD). The peripheral device control circuit 270 may likewise in most respects be conventional or known circuitry, but may incorporate features of AMD's peripheral bus controllers (e.g., the "Southbridge" or AMD-766™ controller).

The local device control subsystem 240 includes a memory controller 290 and conventional subsystems 295 including a bus interface unit (BIU) 300, which communicates via processor bus 310 with the processor(s) 210. In the case of an AMD system, the processor(s) may be one or more AMD-K7™ processors (connected to a subsystem 240 via one or more system buses), while the bus 310 may be AMD's S2K™ bus, which is a widely known and used bus. Other processors and buses are usable in this setting.

The subsystems 295 also include a conventional AGP (accelerated graphics processor) logic 320 (which may comprise, e.g., a graphics card); a graphics adapter table (GART) 330; and a PCI host bridge circuit 340 connected to the PCI bus 280, and configured to control access to the bus 280 and to the peripheral device control 270. Control 270 in turn includes logic and circuitry to control disk drives, e.g. DMA (direct memory access) engines, serial ports and so on.

The subsystems 295 communicate with the memory controller 290, and in particular with a read data FIFO 350 of the memory controller 290, which provides data to them in response to data read requests. The memory controller 290 further includes compensation circuitry 360 in communication with a configuration table 370. These features are described below in connection with FIG. 5.

The memory controller 290 is driven by a system clock 380, which is passed through a PLL (phase-locked loop) circuit 390 to stabilize the clock frequency over PVT variations. As shown in FIG. 4, the clock signal is passed through to the subsystems 295 and, at a doubled frequency, to the compensation circuitry 360. Thus, if the system clock frequency is 100 MHz or 133 MHz, the 2×frequency is 200 MHz or 266 MHz, respectively. Alternatively, the unchanged (1×) clock frequency can be used in place of the 2×clock for the functions described herein.

A system and method according to the present invention will be described with respect to a read operation, but is equally applicable to write operations and any other computer operations where synchronization between two signals is required (e.g. data and data strobe).

Figure 5:
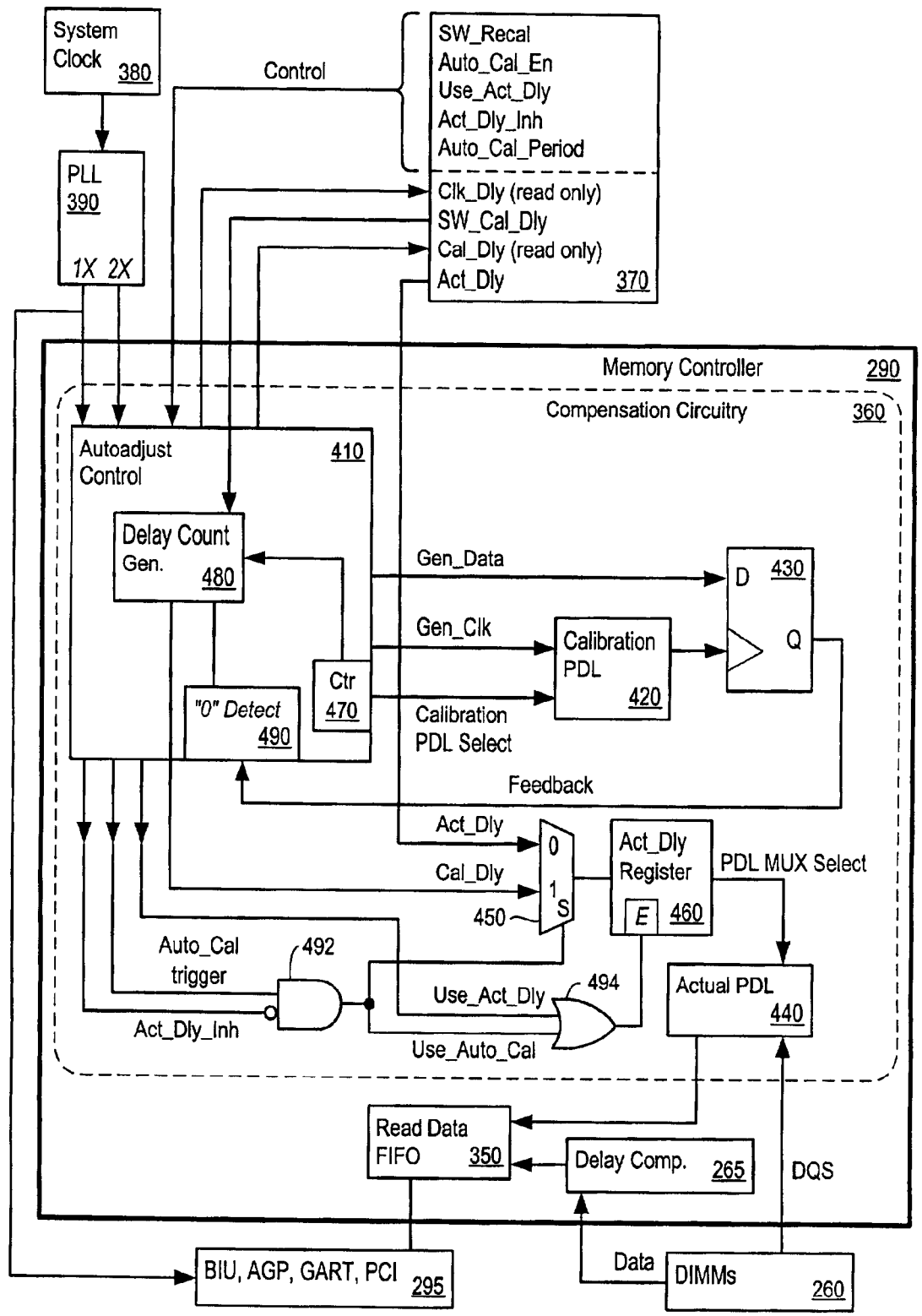
FIG. 5 is a block diagram of a portion of the system of FIG. 4.

FIG. 5 shows greater detail of the memory controller 290 and configuration table 370. The compensation circuit 360 is configured to compensate for PVT variations in a manner to be described below. The circuit 360 includes an autoadjust control circuit 410, a calibration PDL (programmable delay line) 420 having an output coupled to the clock input of a flip-flop 430, and an "actual" PDL 440 configured to govern data transfer operations from memory (such as DIMMs 260) via a delay compensation circuit 265 to the read data FIFO 350. The actual PDL 440 receives an input from a MUX 450 via an actual delay register 460.

The autoadjust control 410 includes a counter 470, a delay count generator 480 and a detector 490, whose operations are described below. The autoadjust control 410 is driven by both of the clock signals (1× and 2×, i.e. doubled) from the PLL 390.

In the setting of a processor-based system, in practice there will typically be many circuits distributed around the edge of a chip (e.g. the local device control 240 shown in FIG. 4), which in a preferred implementation is formed on a single semiconductor chip. That is, the pin-outs for the various bits being transferred to and from DIMMs are distributed around the edge of the chip, and associated with each set of pins is the I/O circuitry for the respective bits.

Figure 7:
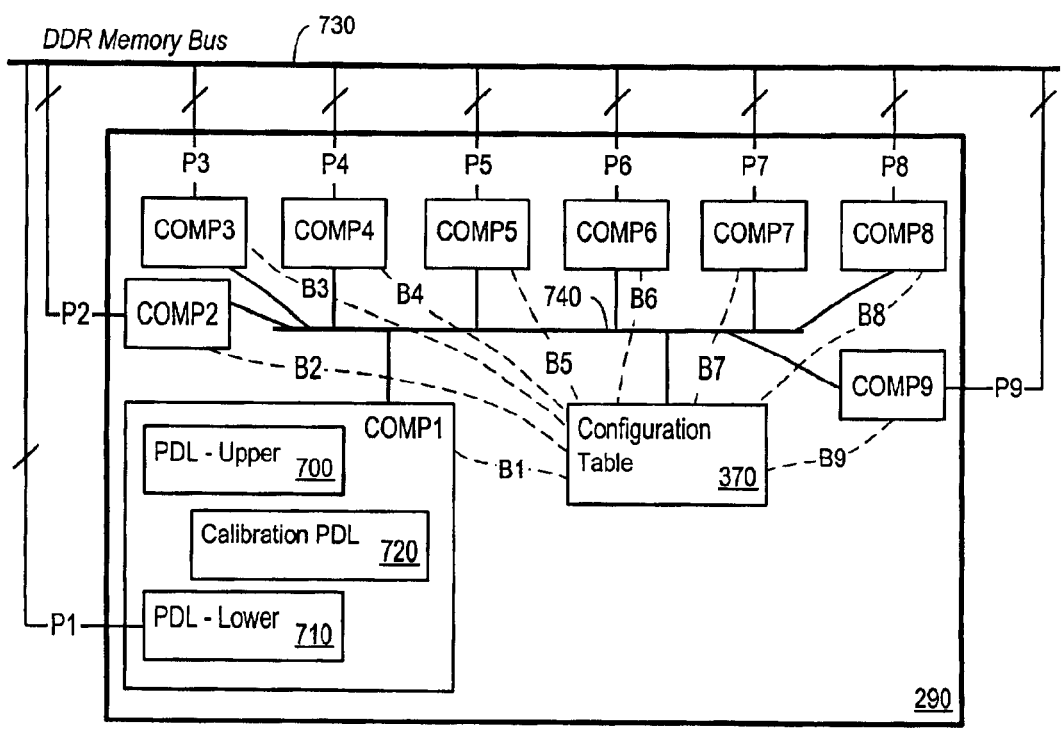
FIG. 7 is a block diagram of a local device control subsystem according to one embodiment of the invention.

For instance, in FIG. 7 a possible layout for the chip 240 of FIG. 4 is shown, including delay compensation circuits COMP1–COMP9 positioned around three edges of the chip. (For clarity, many of the elements of the board 200 as shown in FIG. 4 are not reproduced in FIG. 7.)

Each delay compensation circuit COMP1–COMP9 may be substantially identical to the compensation circuitry 360, with the addition of another actual PDL in each case, so that upper and lower nibbles of a byte can be individually delay-compensated. Thus, each circuit COMP1–COMP9 includes an upper PDL module such as module 700 and a lower PDL module such as module 710, to handle the upper and lower bits, respectively, of a data byte. A calibration PDL such as PDL 720 is associated with each of the pairs of (upper and lower) PDL modules. In this example, the PDL 720 and its associated circuitry may be identical to the calibration PDL 420 (and associated circuitry) in FIG. 5, and the PDL modules 700 and 710 may be as described for the actual PDL 440. Thus, the actual PDL would be replicated for the additional nibble of data, but there would still be only a single read data FIFO 350.

The PDL modules 700, 710 and 720 may thus be regarded as a logical set of delay circuits, in this case with one calibration delay circuit for two actual delay circuits. If one PDL is configured to process the data strobe for a full byte of data, then a logical set could include just one actual delay circuit and one calibration delay circuit. Alternatively, whether the actual delay circuits handle the strobes for one nibble of data, one byte of data or more, the ratio of calibration delay circuits to actual delay circuits may be varied as desired (e.g. multiple actual delay circuits may derived their calibration information from a single calibration delay circuit).

Each delay compensation circuit COMP1–COMP9 is configured in a manner similar to COMP1, with the respective calibration PDLs being position physically close to the modules 700 and 710, so that the calibration PDLs and their associated PDL modules experience similar environments, minimizing differences in PVT (especially voltage and temperature) or other variables that may affect electrical propagation characteristics.

Sets of I/O pins P1–P9 are coupled to the respective delay compensation circuits COMP1–COMP9. The number of pins in each pin set is determined by the number of bits required by the signals handled by the accessed memory, which in turn depends in part upon the type of memory (e.g. ×4, ×8, etc.). In this embodiment, each pin set should include sufficient pins to carry signals for the upper and lower nibbles of data, and thus delay compensation circuits COMP1–COMP8 carry sufficient DQS signals to accommodate a total word size of 64 bits, with the COMP9 signals relating to the DQS strobes for ECC data. The pins P1–P9 communicate with DIMMs or other memory via a memory bus such as DDR memory bus 730.

The configuration table 370 communicates with each delay compensation circuit COMP1–COMP9, both via a common bus 740 and via point-to-point buses B1–B9. The common bus 740 handles variables 1–5 of the configuration table discussed below, while the point-to-point buses B1–B9 are used for variables 69 of the configuration table. Thus, there are nine separate sets of values for variables 6–9—one set of values for each of the delay compensation circuits COMP1–COMP9—while there is one common set of values for the variables 1–5, used by all of the delay compensation circuits COMP1–COMP9.

Other layouts are suitable and can incorporate the advantages of the present invention. For instance, as mentioned above there may be one, several or many PDL modules per calibration PDL, depending upon the local temperature and voltage variability (the lower the variability, the fewer calibration PDLs are needed). Alternatively, there may be more than one calibration PDL for a given circuit, and the results of the different PDLs may be averaged, weighted or separately selected based upon predetermined criteria.

Calibration Methods

In FIG. 5, the actual PDL 440 is the component that delays the DQS strobe (provided by the DIMMs 260), so that it is timed correctly with the arrival of data at the read data FIFO 350, i.e. positioned well within the data valid window. The data and DQS signals will in general traverse somewhat different paths through the system, and in addition the input circuitry (e.g. flip-flops) of the FIFO 350 requires setup time.

Thus, the PDL 440 provides a variable delay time for the DQS strobe. The delay time to be used at a given time in the operation of the system can be selected by providing the PDL 440 with a user- or software-generated actual delay value, or by using the autocalibration procedure described below to generate an empirically determined appropriate delay time. In either case, the delay time to be used is input as a MUX select to the PDL 440, and as described below this effectively causes the DQS input to be delayed by an amount of time corresponding to the MUX select value.

The remainder of the compensation circuitry 360 (other than the actual PDL 440) in FIG. 5 is primarily dedicated to generating the autocalibration value and selecting which delay value to use for the MUX select input to the PDL 440.

Three approaches are presented to generating this MUX select signal:

1. Periodically generate a calibration value using the autocalibration circuitry, to empirically determine the appropriate delay time for the DQS signal. The frequency of this autocalibration operation can be set by software.
2. Generate the autocalibration values as in approach 1, but do so only at times specified by a user or by software, i.e. not in an automatic, periodic fashion. Such times can be determined either arbitrarily, or can be selected based upon certain events, e.g. at boot-up time, in response to a detected temperature rise or fall, in response to a detected variation in voltage or load conditions, etc.
3. Disable the autocalibration operations of approaches 1 and 2, and use a delay value selected by the user or by software to manually set the actual delay values. (The is the "Act_Dly" approach discussed below.)

The circuitry of FIG. 5 implements all three of these approaches, in part by using the variables stored in the configuration table 370, whose use in the present system will be described in detail below.

A method for generating the calculated delay value in a real-time situation is then described, followed by a discussion of specifically how this value is used to delay a DQS data strobe for a data read.

Figure 9:
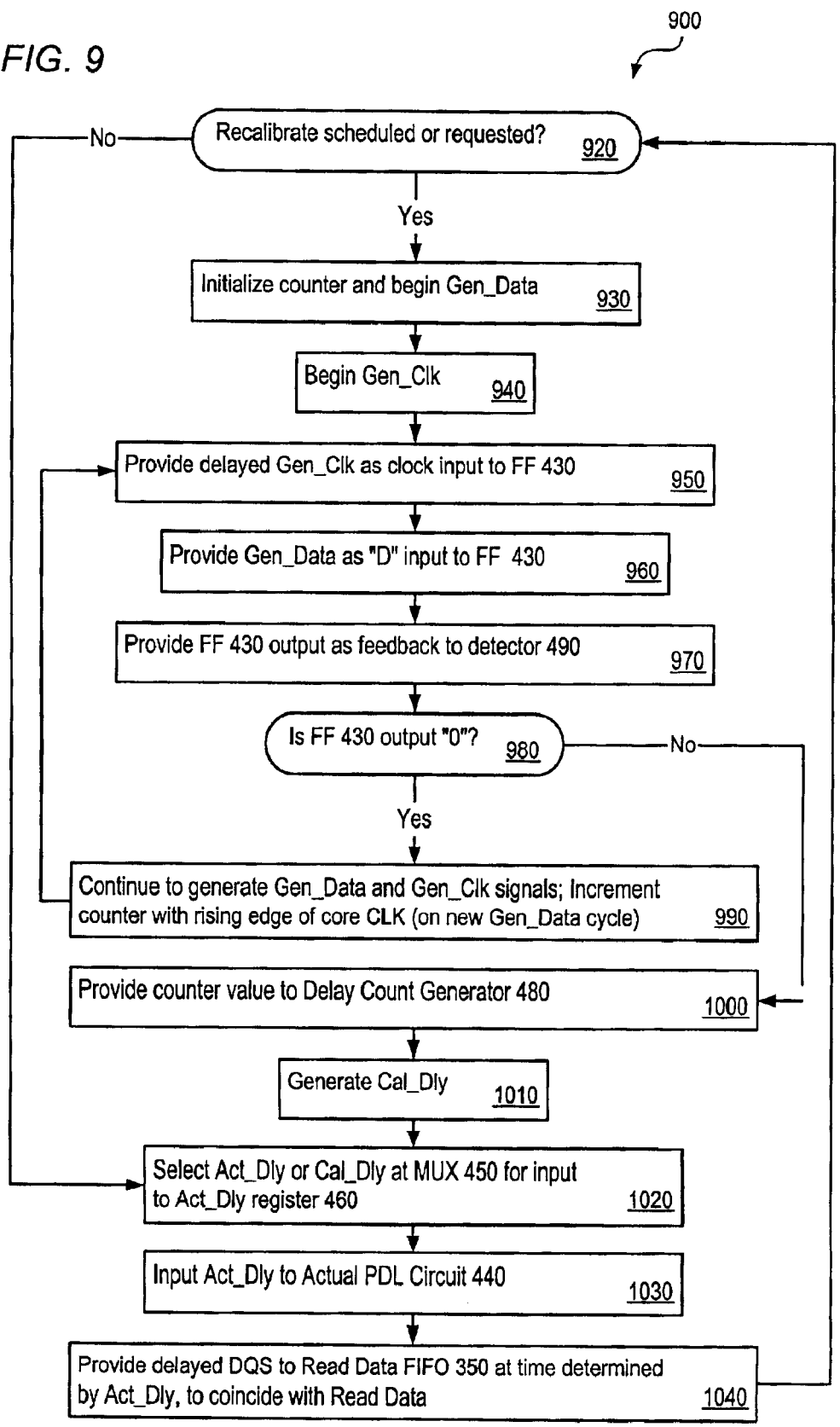
FIG. 9 is a flow chart illustrating a method suitable for carrying out a preferred embodiment of the invention.

FIG. 9 is a flow chart illustrating a method 900 according to the invention suitable for carrying out these procedures.

Definitions of the Configuration Table Variables

The following nine variables have values that are stored in fields of the configuration table 370. As noted above, in the present embodiment variables 1–5 are common to all of the delay compensation circuits (COMP1–COMP9 shown in FIG. 7), while variables 6–9 are particular to each delay compensation circuit.

These are precise definitions for these variables as actually implemented in one embodiment of the invention. Many variations will be apparent to those skilled in the art which can accomplish the features of the invention.

The variables presented below support the multimode operation of the present invention, and the calibration operations are carried out in response to their respective values, as discussed below. Calibration operations are governed in part by software control, and in particular software or program modules that use the configuration table values should be stored in computer memory in a conventional fashion. The various modes of initiating the calibration operations are therefore implemented in such program modules, acting in conjunction with the hardware of the embodiments of the invention discussed herein.

1. SW_Recal (Software Recalibrate)

This is a single bit that provides a way for user-defined software to force a recalibration cycle. Software recalibration is allowed only when the autocalibration feature is disabled (see Auto_Cal_En). A recalibration is forced when this bit is "high", i.e. has a value of 1.

This bit also indicates calibration status by being cleared when a given calibration cycle is complete. While the DDR memory controller does not require this information, it could be helpful in some instances for a programmer to use this value in software.

When a recalibration operation is complete, the autoadjust control hardware 410 recomputes the Cal_Dly (calculated delay) values (see below) for the delay compensation circuits COMP1–COMP9, based upon the values of their respective SW_Cal_Dly fields.

2. Use_Act_Dly (Use Actual Delay)

This is a single bit that provides a way for software to change the PDL setting manually (in the Act_Dly register 460 in FIG. 5). This is done by updating the Act_Dly field directly via a software write. Software sets this bit to indicate to the hardware (autoadjust control 410) that the Act_Dly fields (one for each delay compensation circuit COMP1–9) have been written, and thus that the PDL register(s) 460 should be written with the new Act_Dly values.

Use_Act_Dly should be enabled only when the SW_Recal and Auto_Cal_En bits are disabled (i.e. not set). If Auto_Cal_En is set, writes to the Use_Act_Dly bit are ignored.

3. Auto_Cal_En (Autocalibration Enable)

This is a single bit that provides a way for software to enable the PDL autocalibration function. When this bit is set, all of the Cal_Dly values are recomputed periodically (according to the setting of the Auto_Cal_Period field) for all delay compensation circuits COMP1–COMP9, based on the values of their respective SW_Cal_Dly fields.

4. Act_Dly_Inh (Actual Delay Inhibit)

This is a single bit that provides a mechanism for software to inhibit an autocalibration value from being used to update the delay compensation circuits. Setting this bit to "1" affects both the autocalibration procedure and the software-triggered calibration procedure, but not the procedure using Use_Act_Dly.

5. Auto_Cal_Period (Autocalibration Period)

This field (or variable) specifies how often an autocalibration occurs, and it should be set before the Auto_Cal_En bit is set, and should not be altered so long as the Auto_Cal_En bit is set.

6. Clk_Dly (Clock Delay)

This is a field which is read-only by software, though its value is affected by the operation of the autoadjust control circuitry 410 (i.e. it is changed by hardware). The field's value represents the actual number of PDL buffer delays (i.e. the number of delay elements 500, etc.) required to make up a system clock period, as determined by the calibration procedure. This value is used to calculate the Cal_Dly value.

7. SW_Cal_Dly (Software Calibration Delay)

The value of this field represents the percentage of the total buffers (Clk_Dly) required to delay a DQS signal the right amount to place it at a desired position within the data valid window. Use of the Clk__Dly value in the PDL circuit would force the DQS to occur at the very end of the data valid window (since, as will be seen below, that is how the Clk__Dly value is generated). Multiplying the Clk__Dly delay element count by a predetermined percentage (less than 100%) thus positions the DQS arrival time to the data read FIFO at a correspondingly earlier point in the data valid window.

8. Cal__Dly (Calculated Delay)

Like Clk__Dly, the value of this field is set by the hardware (autocalibration circuitry), but is read-only by software, i.e. is not normally software-settable. The Cal__Dly value is calculated by multiplying. Clk__Dly (a pure number of buffers required to delay DQS to the end of the clock cycle) by SW__Cal__Dly (the percentage of the cycle desired to position DQS where appropriate in the data valid window), and is the result is the actual number of buffers (delay elements) needed to position the DQS strobe at the desired point in the data valid window.

The Cal__Dly value is the actual value that is passed to MUX 450 and thence to the actual PDL 440 (see FIG. 5) when the Act__Dly value is not being used, as described below in the discussion of determining the calculated delay value. The Cal__Dly values is thus used both when a periodic autocalibration is being carried out, or when an autocalibration operation is triggered by software.

The Cal__Dly value is used only if the Act__Dly__Inh bit is not set (i.e., has a value of 0).

9. Act__Dly (Actual Delay)

Figure 6:
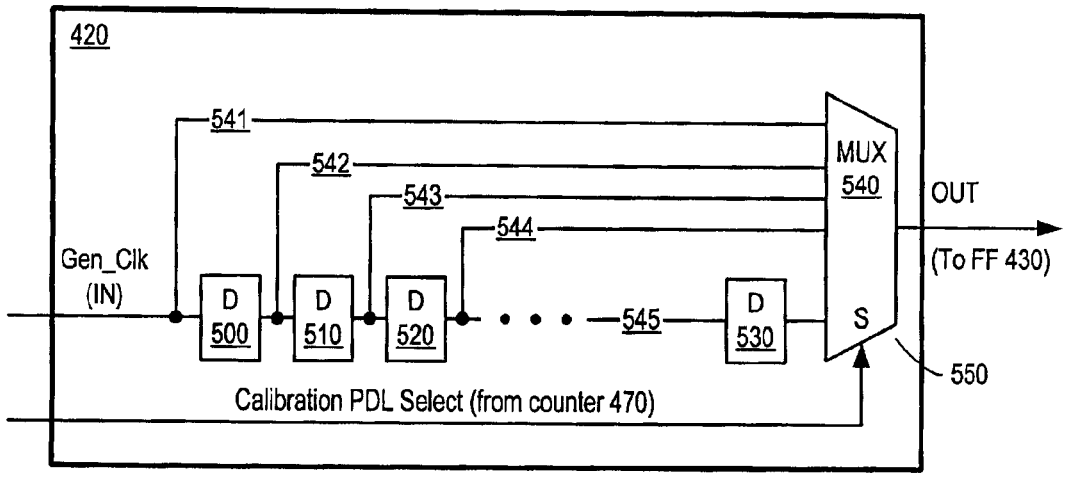
FIG. 6 is a circuit diagram of a delay generating subcircuit suitable for use with an embodiment of the invention.

The value of this field has the same effect as the Cal__Dly field: both fields specify the number of buffers (delay elements) that the PDL 440 will use, by determining the select value of the MUX 540 (see FIG. 6). However, in the case of the Act__Dly field, the value is not updated by the auto-adjust circuitry 410; rather, it can be set and update by software by writing a particular value (i.e. a delay element count) into the Act__Dly register in the configuration table 370 (see FIG. 5) and writing a "1" bit to the Use__Act__Dly field.

Updating the calibration by using a specified Act__Dly value will be referred to in this description as "manually" updating.

The Act__Dly value should be used only when the autocalibration logic is disabled by writing a "0" to the Auto__Cal__En bit.

Determination of the Calculated Delay Value

FIG. 6 shows details of the calibration delay register 420. The actual delay register 440 is similarly designed. A signal Gen__Clk from the control 410 is input in a successive fashion to a series of delay elements 500, 510, 520, ..., 530, which preferably have substantially the same delay value. The delay value should be less than, and preferably a small fraction of, one valid data time window.

In the example discussed above, the delay elements 500–530 would thus have a delay value of substantially less than 3.5 ns, such as 50 picoseconds (ps). Other values are possible, but to be useful the delay values should be no more than about 50% of the valid data window, with smaller values giving more precise results for calibration. In the present example, the delay values are 50 ps/3.5 ns, or about 1.4% of the total data valid window. The smaller the delay value relative to the data valid window, the more iterations will be necessary to calibrate the appropriate delay, so there is a balance to be drawn between having the delay value so coarse that it's not useful, and so fine that it takes too many clock cycles to calibrate. This will be seen below in connection with the description of FIGS. 8A–8B.

The calibration PDL 420 shown in FIGS. 5 and 6 has as an input a Gen__Clk signal, which is derived from the system clock and which is described in greater detail below with respect to FIGS. 8A–8B. The MUX 540 in FIG. 6 has a conventional select input 550, which is driven by the counter 470, and multiple input lines 541–545, with an input line 542–545 being connected to an output of each delay element 500–530, respectively, and input line 541 coupled to the Gen__Clk signal before it passes through any of the delay elements 500–530. Variations on this configuration are possible, with the common factor that there are multiple lines presented as inputs to the MUX 540, each of which passes the Gen__Clk to the MUX inputs, but at different times due to different delays on their respective paths to the MUX.

A calibration operation begins at a scheduled or specifically selected time, as indicated at step 920 in FIG. 9. Referring now to FIGS. 5 and 8A, the Gen__Clk signal (see line 4A) is passed to the flip-flop 430 through the calibration PDL 420. There is an inherent delay in the PDL circuit 420, even via line 541 (see FIG. 6), which does not pass through any of the delay elements 500–530. Thus, between the generation of a Gen__Clk rising edge at T1 (see line 4A of FIG. 8A) and the passing of Gen__Clk through the flip-flop 430 (FIG. 8A, line 5A), there is a small, inherent delay (which is not illustrated for the sake of clarity of FIG. 8A).

To balance this delay, the delay compensation circuit 265 is designed such that the delay inherent in the path through the PDL 420 (and a similar delay through the actual PDL 440) is matched by the delay in the path through the circuit 265. This can be done in a conventional fashion with circuit components having known delay values.

A signal Gen__Data (see lines 2A–2B of FIGS. 8A–8B) is also generated by the autoadjust control 410, and is based upon the system clock. The Gen__Data signal acts as a pseudo-data (i.e. a test data or calibration data) signal in the calibration procedure, to assist in empirically determining the propagation time of an actual data signal. The Gen__Data signal is provided as an input to the flip-flop 430.

The path taken by the Gen__Data signal should be configured so that it has a delay time closely matching that of the path taken by an actual data signal (i.e. from the corresponding DIMM to the read data FIFO 350), so that the calibration procedure using the calibration PDL 420 will be applicable to the circuit using the actual PDL 440, and the actual data strobe will be coordinated with the data from the DIMM so as to occur during the data valid window.

The Gen__Data signal is configured to have a predetermined length, such as two or three system clock cycles (at the 2×rate). The Gen__Clk signal is preferably driven one clock cycle (at the 2×rate) later than the Gen__Data signal, as shown at lines 4A–4B of FIGS. 8A–8B. (Note that the right end of FIG. 8A connects to the left end of FIG. 8B.)

The counter 470 is initialized when a delay calibration operation is commenced, and at the same time a Gen__Data signal is generated (see step 930 of FIG. 9). Along with the generation of each new Gen__Data signal, the counter is incremented (driven by the rising edge of the core clock), as indicated at step 990 of FIG. 9.

The counter should have a range sufficient to count a number of delays that will add up to the predicted or empirically determined delay of an actual signal, and this range will be affected by the length of the delay times chosen for delay elements 500–530. Thus, for a 1.4% delay factor (as in the above example), a counter range of 0–72 would accommodate 100% of a data valid window, which should be sufficient for most situations. In a preferred embodiment of the present invention, a 7-bit counter is used, with a resulting counter range of 0–127 and a corresponding number (127 total) of delay elements 500, etc. to accommodate this counter range.

Note that the system clock provided to the calibration circuit is already PVT-compensated by the PLL 390 (see FIG. 5), and thus the clock frequency is substantially constant, within the range of accuracy of the PLL circuit. If a variable delay were not used to adjust the DQS strobe to the read data FIFO 350, then the uncompensated data and DQS signals would be very likely to get out of step with one another and the DQS would often miss the data valid window (whose size would be relatively constant, due to the PLL-compensated system clock). The present system gains the advantage of the system's PVT compensation by driving the calibration circuitry from the PLL-generated clock.

Figure 8A:
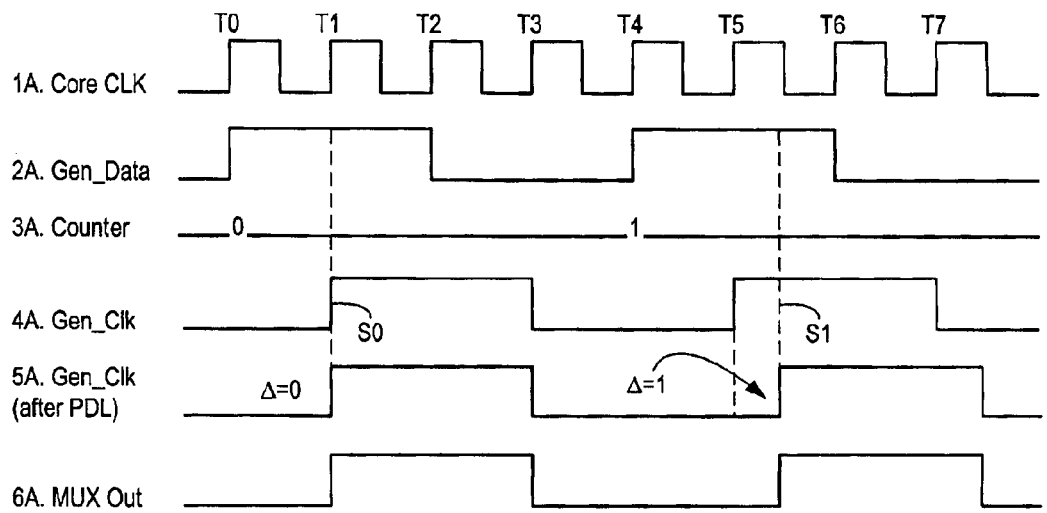
FIGS. 8A–8B are timing diagrams illustrating a subcircuit in one embodiment of the invention.
Figure 8B:
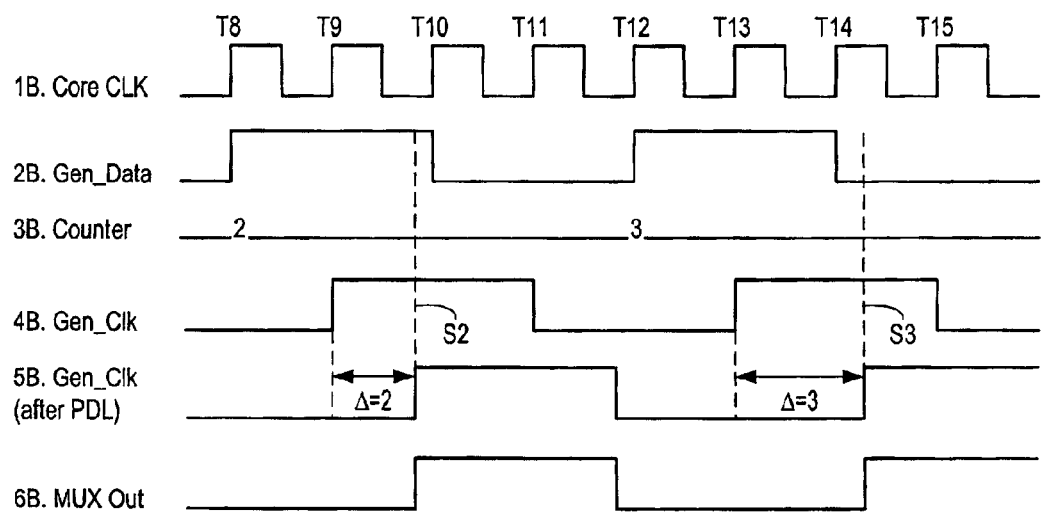

At time T0 in FIG. 8A, Gen_Data is generated, and the counter 470 is initialized to zero. As shown in FIG. 6, the counter value is used as the select input 550 to the MUX 540. At time T1, Gen_Clk is generated and appears on line 541 (see FIG. 6.) Thus, with "0" as the select value for the MUX 540, the value "1" from Gen_Clk on line 541 is selected as the output of the MUX 540. Thus, as indicated at step 950 of FIG. 9, it is the Gen_Clk signal after passing through the PDL 420 (see FIG. 8A, line 5A) that is provided as the clock input to flip-flop 430.

At this time S0, Gen_Data has a value of "1" (see line 2A in FIG. 8A), and this is provided as the "D" input to flip-flop 430 (see FIG. 5 and step 960 of FIG. 9). Thus, the output of flip-flop 430 at this iteration is "1", which is provided as feedback to detector (e.g. a comparator) 490 of the auto-adjust circuit 410 (see FIG. 5 and step 970 of FIG. 9).

Since the detector 490 has not detected a zero value (see step 980 of FIG. 9) in this iteration, the method proceeds to step 990, i.e. continues to generate the Gen_Data and Gen_Clk signals. The Gen_Data and Gen_Clk signals have falling edges occurring at about times T2 and T3, respectively (see FIG. 8A), and at T4 a new Gen_Data signal is generated, at which time the counter is incremented to "1" (see lines 2A–3A of FIG. 8B, and step 990 of FIG. 9). The method proceeds back to step 950 with the new value of the counter and a new Gen_Clk generated at time T5.

Since the counter value is now 1, the select signal input to MUX 540 (FIG. 6) is also 1, so line 542 will be selected as the output for the MUX 540. The signal on this line will change from 0 to 1 about 50 ps (i.e. one buffer period) after the rising edge on line 541, because the signal first passes through the delay element 500. As a result, the Gen_Data signal is sampled at a time one delta (i.e. one buffer period) later relative to where it was sampled in the previous iteration.

Thus, the first sample time S0 of the Gen_Data signal occurs at a time S0≈T1 (S0 is not exactly T1, because of the inherent delay in the PDL circuit as discussed above). In the next iteration, the Gen_Data signal is sampled at a time S1≈T5+Δ, where Δ=1 reflects the number of buffer periods delay at this time (because the counter is at one).

The Gen_Data value is still "1" at this time S1 (see FIG. 8A), and thus the output of flip-flop 430 is 1, and the detector 490 does not detect a zero (see step 980 of FIG. 9). The method therefore proceeds again to step 950. Again, Gen_Data is regenerated, the counter is incremented to 2, and the Gen_Clk signal is delayed one more delay time before being passed through the MUX 540 as a "1" (since the counter now selects line 2 of the MUX, i.e. line 542 in FIG. 6, whose signal has now passed through two delay elements 500 and 510).

This causes the Gen_Data signal to be sampled at the flip-flop 430 at a time S2≈T9+Δ, where Δ=2 (i.e. the Δ value is now two delay periods long). In the example of FIG. 8B, the value of Gen_Data on line 2B at this time S2 is still "1", so when step 980 is again reached, another iteration is begun at steps 990 and 950, etc.

In the next iteration, the counter value is 3, so the time S3 at which Gen_Data is sampled (relative to its rising edge at time T13) is S3≈T3+Δ, where Δ=3 (i.e. the Δ value is now three delay periods long). In the example given, Gen_Data has by this time gone to zero, i.e. the sampling is done after Gen_Data's falling edge at time T14 (see lines 1B and 2B in FIG. 8B).

Accordingly, at step 980 the output of the flip-flop 430 is detected by detector 490 to be zero. The counter value that resulted in this zero output is "3", which is provided as input to the delay counter generator 480 (see FIG. 5), as indicated in step 1000 of FIG. 9.

The flip-flop 430 thus acts as a gate, allowing each value of Gen_Data through as it is triggered or clocked by the output of the calibration PDL 420. Other implementations, using one or more MUXes, transistor networks, flip-flop circuits or the like may be used, as long as this function is met.

The value of the counter that led to a detection of the zero value for Gen_Data is set as the value for Clk_Dly in the configuration table 370. Each delay compensation circuit COMP1–COMP9 in FIG. 7 will thus independently set its own value for Clk_Dly in table 370.

Figure 1:
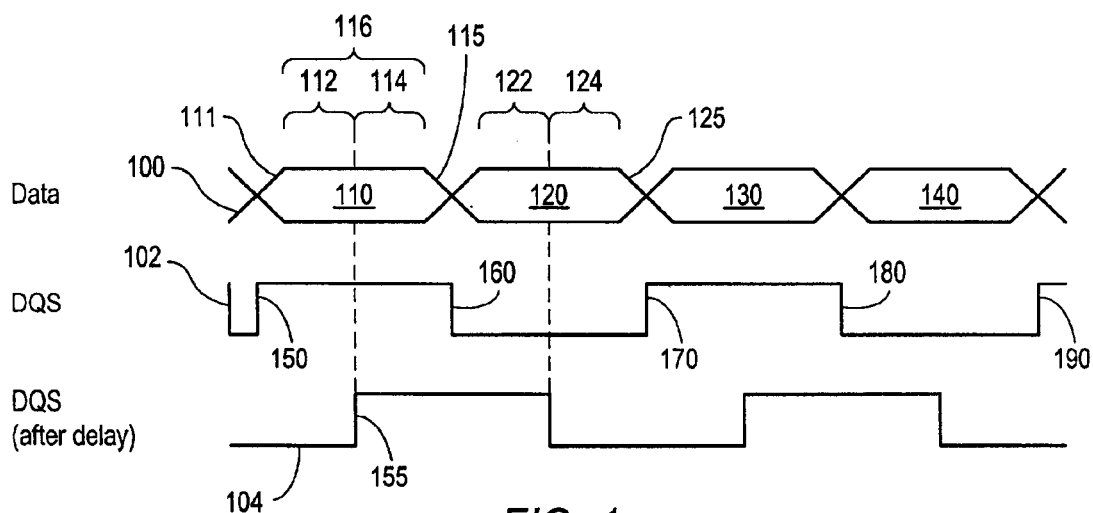
FIG. 1 is a timing diagram illustrating a double data rate read operation with data strobe signals.
Figure 2A:
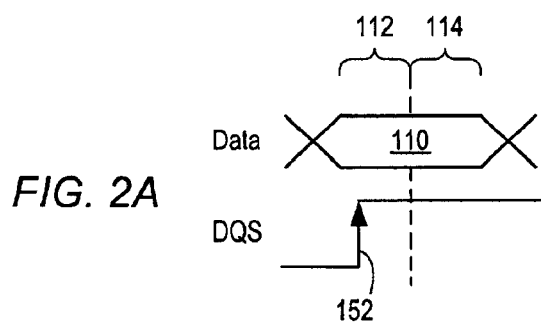
FIGS. 2A–2C are diagrams illustrating various DQS timings with respect to a data packet setup and hold period.
Figure 2B:
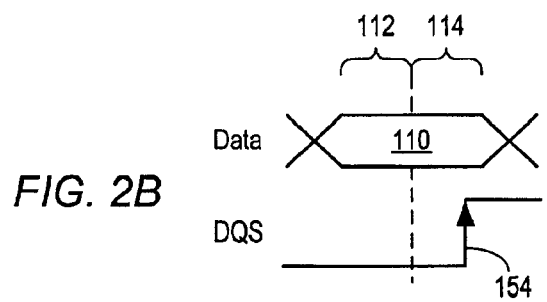
Figure 2C:
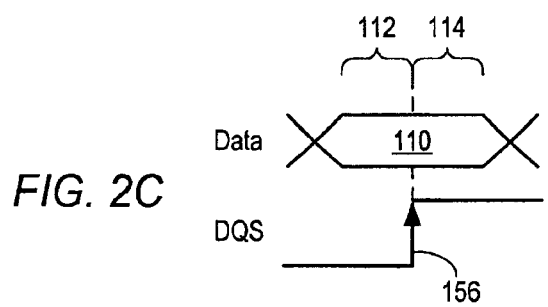
Figure 3:
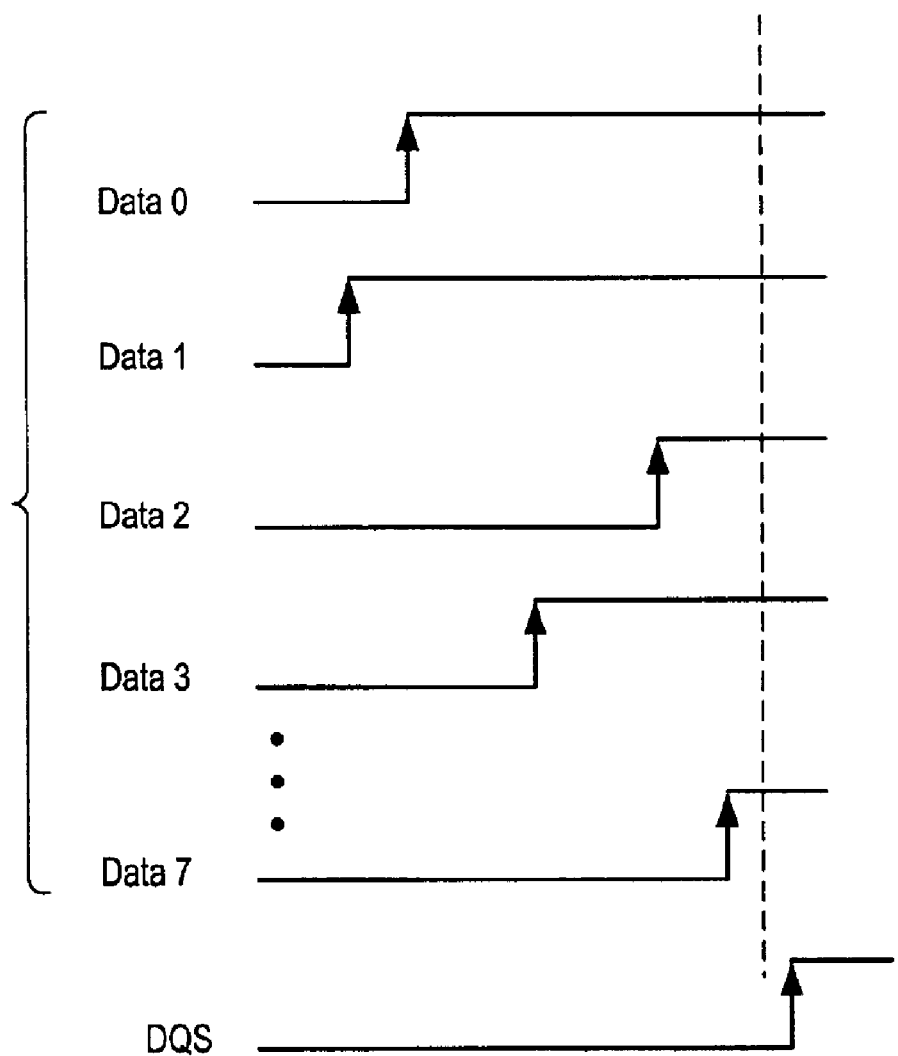
FIG. 3 is a timing diagram for a byte of data, illustrating misalignment of individual bits due to effective path length differences.

The value of SW_Cal_Dly in the configuration table 370 depends in part upon the clock speed of the system (e.g. whether it is 100 MHz, 133 MHz, and so on). For instance, if the user determines that for a 100 MHz clock speed in a DDR system, the desired DQS strobe time for a resultant 3.5 ns data valid window is 2.05 ns after the 0.5 ns initial transition 111 (see FIG. 1), then the value for SW_Cal_Dly will be about 2.05 ns/5 ns=41%. In this case, SW_Cal_Dly will be set to 0.41.

The 2.05 ns delay is an empirically determined delay time, i.e. it is determined from an actual implementation of a system, given the circuit design parameters, board layout, etc. A different system design will in general have a different DQS delay requirement, though in general for a given clock speed the size of the data valid window will be roughly the same across systems, and thus the required delay times for different systems will be similar.

For a 133 MHz DDR system, the data valid window will be smaller, namely about 3.75 ns instead of 5 ns. If it is determined (as for one system implemented by applicant) that the desired delay time is 1.5625 ns, then the delay value for SW_Cal_Dly will be 1.5625/3.5=41.7%. If the desired delay time were 1.5 ns, then SW_Cal_Dly would be given a value of 1.5/3.75=40%, and so on.

At step 1010, the calculated delay value Cal_Dly is now generated, which is accomplished for the variables as defined simply by multiplying Clk_Dly (i.e. the value of the counter that led to a detection of the zero value for Gen_Data) by SW_Cal_Dly. This yields a number of delay elements 500–530 in the actual PDL 440 that the DQS strobe should traverse to delay it sufficiently that it reaches the read data FIFO 350 during the data valid window for incoming data.

The number of delay elements selected must be an integer in this embodiment, and thus the calculated value for Cal_

Dly can be truncated, or rounded up or down as desired. The finer the gradation of delays (i.e. the more numerous the delay elements in the calibration and actual PDL circuits, and the shorter the delay time for each element), the less error will be introduced by the truncation or rounding operation.

As an alternative embodiment, the actual PDL 440 and the calibration PDL 420 may have different numbers of delay elements 500, etc., and the above procedure can accommodate this by multiplying the empirically determined value Clk_Dly by the correct ratio. For instance, if the actual PDL has twice as many delay elements (with each delay element causing half the delay time) as the calibration PDL, Clk_Dly (or the SW_Cal_Dly) would be multiplied by two to accommodate this.

Use of the Calculated Delay Value and Actual Delay Value in Strobing Data in Real Time As mentioned above, in a preferred embodiment the actual PDL 440 is essentially identical to the calibration PDL 420 (see FIG. 6), except that the actual PDL 440 receives its input from the Act_Dly register 460 rather than from the counter 470. Thus, when the Cal_Dly value is provided as the MUX select to the actual PDL 440, the DQS strobe is not output until it has traversed a number of delay elements corresponding to this Cal_Dly value. The actual PDL thus automatically delays the DQS strobe by an amount which correctly positions it within the data valid window.

In FIG. 5, the Cal_Dly value is provided as the line 1 input of the MUX 450. The select of MUX 450 line 1 should be triggered when an autocalibration is completed, e.g. upon generation of an Auto_Cal trigger either at the times indicated by Auto_Cal_Period or at other times generated in software. This Auto_Cal trigger can be input to an AND gate 492, whose other input is Act_Dly_Inh (inverted, as shown). Thus, the output of AND gate 492 will be high only if the Act_Dly_Inh bit is set and an autocalibration trigger is present.

The name "Act_Dly_Inh" (actual delay inhibit) here refers to the fact that when the Act_Dly value is to be used, the actual delay register 460 is inhibited from updating using the Cal_Dly value. Thus, Act_Dly_Inh is set to 1 when the Act_Dly value is to be used, which causes the output of AND gate 492 to go low, which causes line 0 (i.e. the Act_Dly value) to be selected at MUX 450 as in the input to the actual delay register 460.

If the Auto_Cal trigger is high, this causes Cal_Dly on line 10f MUX 450 to be selected (if Act_Dly_Inh is low), and output to (and latched at) the Act_Dly register 460. This will occur only when the Auto_Cal_En bit is set high.

The normal setting (default value) for the Auto_Cal trigger should be low, i.e. 0, so that the default selection for MUX 450 is line 0, where Act_Dly is connected. Thus, the Auto_Cal trigger will be 0 unless Auto_Cal_En is 1 and a new calibration procedure has been executed. Once the new Cal_Dly value is latched into the Act_Dly register 460, the Auto_Cal trigger is driven low again.

This Cal_Dly value can, as noted above, be recalibrated automatically at a frequency set in software. However, if recalibration is carried out while a read operation is pending, this could corrupt the data capture operation, so the system should be configured to update the Act_Dly register 460 with new calibration values only when no read operations are taking place. In general, this will provide sufficient opportunities for the system to recalibrate as often as necessary to track voltage, temperature or other variations.

The recalibration procedure can also be carried out only at times specified by a user or in software, e.g. when particular operations take place (boot-up, large data transfers, etc.) or when voltage or temperature fluctuate past a predefined point, and so on.

Alternatively, as indicated above, the autocalibration procedure can be bypassed altogether by setting the Auto_Cal_En bit to zero and setting the Act_Dly_Inh bit to one. This will cause the output of AND gate 492 to be low, which is used to select Act_Dly as the signal (on line 0) passed by MUX 450 to the actual PDL register 460, which is then used by the actual PDL 440. The Act_Dly value can be set by the user as desired, or it can be set or reset by software.

The Act_Dly register 460 is updated in response to signals on its enable input E as shown in FIG. 5. This can be done either when Use_Act_Dly is set to "1" or at times specified by software, such as at the times indicated by Auto_Cal_Period or at other times generated in software. At such times, an Auto_Cal trigger can be generated, which is input to an AND gate 492, whose other input is the inverse of Act_Dly_Inh. Thus, the output of AND gate 492 will be high only if the Act_Dly_Inh bit is low and an autocalibration trigger is present.

This output is used as an input to an OR gate 494, whose other input is the Use_Act_Dly value. Thus, when either of this inputs is 1, a high signal appears on the enable line E of the Act_Dly register 460, which is then updated with the selected value (Cal_Dly or Act_Dly) at the MUX 450.

Other variations on this circuitry are possible, and still can accomplish the periodic calibration, software-selected calibration and Act_Dly override operations described.

The above description has been directed to a read operation. It is equally applicable to a write operation and other memory access operations. However, the invention is more broadly applicable; it can be used in situations where two signals need to be presented to a device at predetermined times relative to one another.

Thus, in the general case the actual signal circuit (here, the actual PDL and associated circuitry) is associated with a calibration circuit, which is preferably adjacent the actual circuit or at least is in an environment designed such that the calibration results will be applicable to the actual circuit.

By the use of a pseudo-signal (in the above example, the Gen_Data signal) that is similar in some respect to the actual expected signals (thus, the Gen_Data signal and actual data signals may have the same length, or have lengths that are different by a known factor), the calibration circuit can determine the offset necessary to generate a properly timed arrival of the two signals. This offset is then provided to the actual circuit, which thereafter uses it to govern the delivery of the actual signals.

While the above embodiment contemplates the use of a clock signal driven by a PLL, this feature also may be altered. If a non-PLL clock is used, in fact, the calibration operation will work as described. In an actual computer system, it is unlikely that a non-PLL clock would be used, but in the broader application of coordinating signal arrival times, it will often be irrelevant whether the clock signal has been phase-locked or not.

Generally, an embodiment of the invention may be as a multimode circuit that coordinates the arrival of a first signal with a second signal, where the second signal travels through a given data path. (In the examples discussed herein, the first signal may be a DQS strobe and the second signal may be a data signal.) Calibration for the first signal is achieved either through a calibration procedure or through selection of a predetermined value (e.g. the Act_Dly value), and the calibration procedure may be either at selected intervals or at user- or software-driven times. Logic (hardware and/or software) is provided to select among the different modes of calibration (e.g. one of two automatic calibration procedures or the use of the predetermined value).

Thus generalized, it can be seen that the present invention can be applied to various systems, including networks, video circuits, audio circuits, and in general to circuits where coordination between signals is desired.

What is claimed is:

1. A multimode system for coordinating a data strobe with a data valid window in a read data operation over a data path from a memory module, including:
   a calibration subsystem configured to provide an actual delay time to the data path to delay the data strobe by an amount sufficient to coordinate the data strobe with the data valid window;
   a calibration initiation module stored in the multimode system, coupled to the calibration subsystem, and configured to provide at least a first mode and a second mode of initiating a calibration operation by the calibration subsystem;
   wherein the first mode is configured to initiate a calibration operation in response to a change in at least one environmental condition.

2. The multimode system of claim 1, wherein:
   the first mode is configured to initiate a calibration operation in response to a nonperiodic trigger for the calibration subsystem; and
   the second mode is configured to initiate a calibration operation at predetermined intervals.

3. The multimode system of claim 2, wherein the first mode is configured to initiate a calibration operation in response to a trigger stored in the system as part of the calibration initiation module.

4. The multimode system of claim 2, wherein the predetermined intervals are stored in the multimode system as a user-determined autocalibration period.

5. The multimode system of claim 2, wherein the calibration initiation module is further configured to provide a third mode of initiating a calibration operation, the third mode being configured to initiate a calibration operation in response to user input.

6. The multimode system of claim 2, further including:
   a configuration table configured to store a plurality of configuration values, including a first value relating to the first mode and a second value relating to the second mode.

7. The multimode system of claim 5, including a user input module stored in the multimode system and having a user interface mechanism configured to receive the user input.

8. The multimode system of claim 5, including a circuit configured to receive the user input via user interface hardware.

9. The multimode system of claim 6, wherein:
   the calibration initiation module is further configured to provide a third mode of initiating a calibration operation, the third mode being configured to initiate a calibration operation in response to user input; and
   the configuration table further includes a third value relating to the third mode.

10. The multimode system of claim 6, wherein the first value comprises an autocalibration enable value configured to initiate a calibration operation relating to the first mode.

11. The multimode system of claim 6, wherein the first value comprises an autocalibration period value configured to initiate a calibration operation at the predetermined intervals of the second mode.

12. The multimode system of claim 9, wherein the third value comprises an actual delay value selectable by the user input.

13. The multimode system of claim 12, wherein the configuration table is further configured to store a signal that selects use of the actual delay value.

14. The multimode system of claim 1, wherein the environmental condition includes temperature sensed near the calibration subsystem.

15. The multimode system of claim 1, wherein the environmental condition includes a voltage sampled at a predetermined location in the multimode system.

16. The multimode system of claim 1, wherein the environmental condition includes a load condition sampled at a predetermined location in the multimode system.

17. The multimode system of claim 1, wherein:
   the multimode system comprises a processor-based system including a memory controller; and
   the memory controller is configured to act in cooperation with the calibration subsystem.

18. The multimode system of claim 1, wherein:
   the multimode system comprises a memory controller configured to operate in cooperation with a processor-based system; and
   the memory controller is configured to act in cooperation with the calibration subsystem.

19. A method of operating a calibration subsystem of a memory controller of a processor-based system in multiple modes to coordinate a data strobe with a data valid window for a data read operation from a memory module, including the steps of:
   storing a first value in a configuration table coupled to the memory controller, the first value relating to a first mode of operation and configured to initiate a calibration operation in response to a nonperiodic trigger;
   storing a second value in a configuration table coupled to the memory controller, the second value relating to a second mode of operation and configured to initiate a calibration operation at predetermined intervals.

20. The method of claim 19, further including the step of storing a calibration initiation module in a memory of the processor-based system, the calibration initiation module being configured to execute calibration operations based at least in part upon the values stored in the configuration table.

21. The method of claim 20, wherein the calibration initiation module includes a trigger configured to initiate a calibration operation in response to the first value and at least one environmental condition.

22. The method of claim 21, wherein the environmental condition includes a temperature sensed near the calibration subsystem.

23. The method of claim 21, wherein the environmental condition includes a voltage sampled at a predetermined location in the processor-based system.

24. The method of claim 21, wherein the environmental condition includes a load condition sampled at a predetermined location in the processor-based system.

25. The method of claim 21, further including the steps of:
   storing a third value in the configuration table, the third value representing a user-determined autocalibration period; and
   in the second mode of operation, initiating a calibration operation in response to the third value.

26. The method of claim 21, further including the step of:
storing a fourth value in the configuration table, the fourth value relating to a third mode of operation and configured to initiate a calibration operation in response to user input.

27. The method of claim 26, including the step of storing an actual delay value as the fourth value.

28. The method of claim 19, further including the step of storing an autocalibration period value as the second value.

29. The method of claim 19, further including the steps of:
generating a calibrated delay value based upon an executed calibration operation; providing the calibration delay value to a data circuit coupled to the memory module, the data circuit configured to transmit at least the data strobe from the memory module to a receiving device; and based upon the calibration delay value, delaying the data strobe by an amount sufficient to coordinate arrival of the data strobe with the data valid window for data received by the receiving component from the memory module.

30. The method of claim 29, further including the step of adjusting the calibration delay value before providing it to the data circuit in a predetermined manner.

31. The method of claim 30, wherein the step of adjusting the calibration delay value includes reducing the calibration delay value by a predetermined percentage.

32. A multimode circuit for coordinating arrival of a first signal and a second signal at a receiving device, where the second signal is coupled to a signal path, including:

a calibration subsystem configured to generate a calibration delay time for a calibration signal to pass through a calibration path, the calibration path being configured to have an effective path length substantially matching an effective path length for at least a portion of the signal path; and selection logic configured to select one of the calibration delay time and an actual delay time as a delay value to apply to the first signal.

33. The multimode circuit of claim 32, wherein the calibration subsystem includes logic configured to generate a delay count determined by a counter value relating to the calibration delay count.

34. The multimode circuit of claim 33, wherein the calibration subsystem is configured to adjust the delay count and provide the adjusted delay count as the delay value for the first signal.

35. The multimode circuit of claim 34, wherein the adjusted delay count comprises a percentage of the counter value.

* * * * *